United States Patent
Bucher

(10) Patent No.: US 11,778,786 B2
(45) Date of Patent: Oct. 3, 2023

(54) THERMAL BRIDGE FOR AN ELECTRICAL COMPONENT

(71) Applicant: TE Connectivity Services GmbH, Schaffhausen (CH)

(72) Inventor: Alan Weir Bucher, Manheim, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 97 days.

(21) Appl. No.: 17/558,655

(22) Filed: Dec. 22, 2021

(65) Prior Publication Data
US 2023/0200020 A1  Jun. 22, 2023

(51) Int. Cl.
H05K 7/20 (2006.01)
F28F 3/06 (2006.01)
H05K 1/02 (2006.01)

(52) U.S. Cl.
CPC ............ *H05K 7/20445* (2013.01); *F28F 3/06* (2013.01); *H05K 1/0203* (2013.01); *H05K 7/2049* (2013.01); *H05K 7/20472* (2013.01); *H05K 2201/06* (2013.01)

(58) Field of Classification Search
CPC .............. H05K 7/2049; H05K 1/0203; H05K 7/20472; H05K 2201/06; F28F 3/06
See application file for complete search history.

(56) References Cited

U.S. PATENT DOCUMENTS

| 4,448,240 A | * | 5/1984 | Sharon | H01L 23/4338 165/185 |
| 4,498,530 A | * | 2/1985 | Lipschutz | H01L 23/4338 361/717 |
| 7,277,291 B2 | * | 10/2007 | Ross | H05K 7/2049 361/701 |
| 9,391,407 B1 | | 7/2016 | Bucher et al. | |
| 9,407,046 B1 | | 8/2016 | Bucher | |
| 9,419,367 B2 | | 8/2016 | Henry et al. | |
| 9,509,102 B2 | | 11/2016 | Sharf et al. | |
| 9,583,865 B2 | | 2/2017 | Sharf et al. | |
| 9,666,962 B1 | | 5/2017 | Bucher | |
| 9,668,379 B1 | | 5/2017 | Bucher | |
| 9,668,380 B2 | | 5/2017 | Bucher | |
| 9,841,772 B2 | | 12/2017 | Bucher | |
| 9,924,615 B2 | | 3/2018 | Bucher | |
| 9,958,497 B2 | | 5/2018 | Sharf et al. | |

(Continued)

OTHER PUBLICATIONS

Corresponding U.S. Appl. No. 16/935,493, filed Jul. 22, 2020. (46 pages).

(Continued)

*Primary Examiner* — Lionel Nouketcha

(57) ABSTRACT

A thermal bridge includes an upper bridge assembly including upper plates arranged in an upper plate stack and a lower bridge assembly including lower plates arranged in a lower plate stack. Outer ends of the lower plates face and thermally couple to an electrical component. The upper plates and the lower plates are arranged in plate pairs. A spring element forces the upper plates and the lower plates of the plate pairs apart. The upper plates include upper limit tabs and the lower plates include lower limit tabs. The upper limit tabs and the lower limit tabs operate to limit spreading apart of the upper plates and the lower plates against the opening forces of the spring element.

20 Claims, 6 Drawing Sheets

(56) References Cited

U.S. PATENT DOCUMENTS

| | | |
|---|---|---|
| 10,020,614 B1 | 7/2018 | Bucher |
| 10,575,442 B2 | 2/2020 | Bucher |
| 10,993,352 B2 | 4/2021 | Bucher |
| 2020/0373706 A1 | 11/2020 | Bucher et al. |
| 2021/0084791 A1 | 3/2021 | Bucher |

OTHER PUBLICATIONS

Corresponding U.S. Appl. No. 16/927,446, filed Jul. 13, 2020. (38 pages).

* cited by examiner

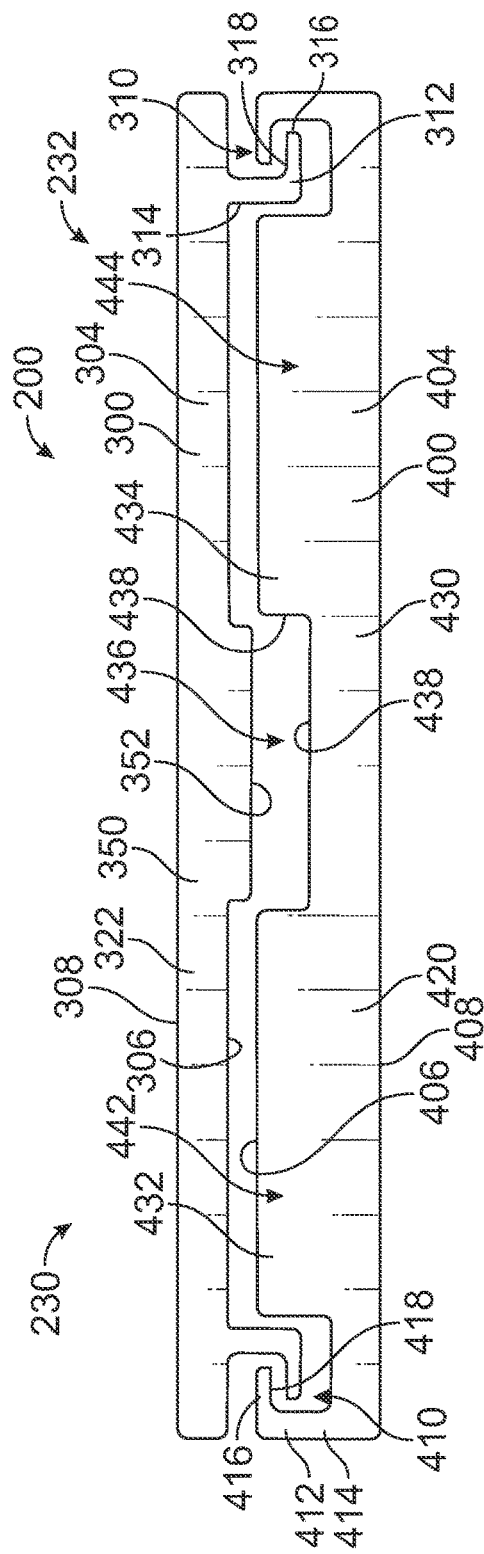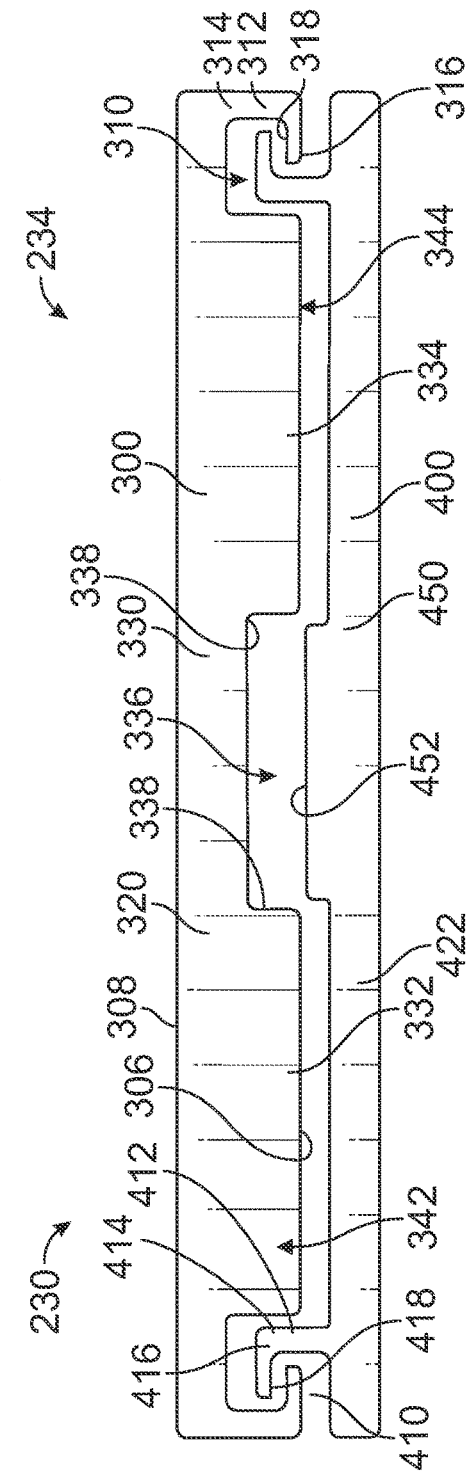

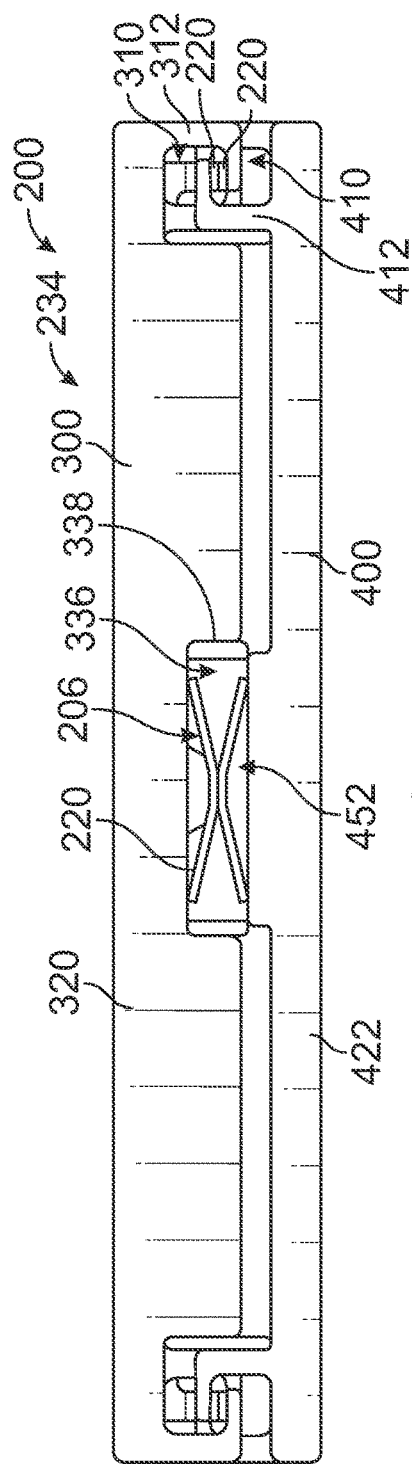

THERMAL BRIDGE FOR AN ELECTRICAL COMPONENT

BACKGROUND OF THE INVENTION

The subject matter herein relates generally to heat dissipation for electrical components.

It may be desirable to transfer thermal energy (or heat) away from designated components of a system or device. Some systems use electrical components, such as electrical connectors, to transmit data and/or electrical power to and from different systems or devices. Some systems use electrical components, such as pluggable modules for transmitting data signals through communication cable(s) in the form of optical signals and/or electrical signals. Some systems use electrical components, such as integrated circuits, for controlling the system. The electrical components define heat generating sources within the system.

A common challenge that confronts developers of electrical systems is heat management. Thermal energy generated by electrical components within a system can degrade performance or even damage components of the system. To dissipate the thermal energy, systems include a thermal component, such as a heat sink, which engages the heat source, absorbs the thermal energy from the heat source, and transfers the thermal energy away. The heat sink is typically thermally coupled to another thermal component at yet another thermal interface. The components lose efficiency at each thermal interface. Additionally, it is difficult to achieve efficient thermal coupling at the interfaces due to limited thermal interface areas and variations in the surfaces, such as due to surface flatness of the interfacing surfaces.

Accordingly, there is a need for a thermal transfer assembly that efficiently transfers thermal energy away from an electrical component.

BRIEF DESCRIPTION OF THE INVENTION

In one embodiment, a thermal bridge is provided and includes an upper bridge assembly including a plurality of upper plates arranged in an upper plate stack. Each upper plate has a front end and a rear end. Each upper plate has sides between the front end and the rear end. Each upper plate has an inner end and an outer end. The thermal bridge includes a lower bridge assembly including a plurality of lower plates arranged in a lower plate stack. Each lower plate has a front end and a rear end. Each lower plate has sides between the front end and the rear end. Each lower plate has an inner end and an outer end. The outer ends of the lower plates are configured to face and thermally couple to an electrical component. The sides of the lower plates face the sides of the upper plates to thermally interface the lower plates with the upper plates. The thermal bridge includes a spring element positioned between the upper bridge assembly and the lower bridge assembly. The spring element includes an upper spring member engaging the upper plates to bias the upper plates with an opening force generally away from the lower plates. The spring element includes a lower spring member engaging the lower plates to bias the lower plates with an opening force generally away from the upper plates. The upper plates and the lower plates are arranged in plate pairs. The spring element forces the upper plates and the lower plates of the plate pairs apart. The upper plates include upper limit tabs. The lower plates include lower limit tabs. The upper limit tabs and the lower limit tabs operate to limit spreading apart of the upper plates and the lower plates against the opening forces of the spring element.

In another embodiment, a thermal bridge is provided and includes an upper bridge assembly including a plurality of upper plates arranged in an upper plate stack. Each upper plate has a front end and a rear end. Each upper plate has sides between the front end and the rear end. Each upper plate has an inner end and an outer end. The thermal bridge includes a lower bridge assembly including a plurality of lower plates arranged in a lower plate stack. Each lower plate has a front end and a rear end. Each lower plate has sides between the front end and the rear end. Each lower plate has an inner end and an outer end. The outer ends of the lower plates are configured to face and thermally couple to an electrical component. The sides of the lower plates face the sides of the upper plates to thermally interface the lower plates with the upper plates. The thermal bridge includes a spring element positioned between the upper bridge assembly and the lower bridge assembly. The spring element includes an upper spring member engaging the upper plates to bias the upper plates with an opening force generally away from the lower plates. The spring element includes a lower spring member engaging the lower plates to bias the lower plates with an opening force generally away from the upper plates. The thermal bridge includes a bridge frame having a first side plate at a first side of the thermal bridge and a second side plate at a second side of the terminal bridge. The bridge frame includes a spar connecting the first and second side plates. The spar passes through the thermal bridge between the upper plate stack and the lower plate stack. The upper plates and the lower plates are arranged in plate pairs. The spring element forces the upper plates and the lower plates of the plate pairs apart. The upper plates include upper limit tabs. The lower plates include lower limit tabs. The spar is located between the upper limit tabs and the lower limit tabs. The upper limit tabs and the lower limit tabs engage the spar to limit spreading apart of the upper plates and the lower plates against the opening forces of the spring element.

In a further embodiment, a thermal bridge is provided and includes an upper bridge assembly including a plurality of upper plates arranged in an upper plate stack. Each upper plate has a front end and a rear end. Each upper plate has sides between the front end and the rear end. Each upper plate has an inner end and an outer end. The upper plates include upper bridge plates and upper spacer plates. The upper bridge plates have upper overlapping regions. Each upper bridge plate includes a base, a first bridge portion extending from the base and a second bridge portion extending from the base with an upper gap between the first bridge portion and the second bridge portion of the upper bridge plate. Each upper spacer plate includes a spacer base and a spacer tab extending from the spacer base. The thermal bridge includes a lower bridge assembly includes a plurality of lower plates arranged in a lower plate stack. Each lower plate has a front end and a rear end. Each lower plate has sides between the front end and the rear end. Each lower plate has an inner end and an outer end. The lower plates include lower bridge plates and lower spacer plates. The lower bridge plates have lower overlapping regions. The lower plates are configured to face and thermally couple to an electrical component. The lower spacer plates are aligned with the upper bridge plates and the lower bridge plates are aligned with the upper spacer plates such that the lower overlapping regions overlap with the upper overlapping regions. The sides of the lower bridge plates thermally interface with the sides of the upper bridge plates. The upper bridge plates are aligned with the lower spacer plates and the lower bridge plates are aligned with the upper spacer plates. Each lower bridge plate includes a base, a first bridge portion extending from the base and a second bridge portion extending from the base with a lower gap between the first bridge portion and the second bridge portion of the lower bridge plate. Each lower spacer plate include a spacer base and a spacer tab extending from the spacer base. The thermal bridge includes a spring element positioned between the upper bridge assembly and the lower bridge assembly. The spring element includes an upper spring member engaging the upper plates to bias the upper plates with an opening force in a first biasing direction generally away from the lower plates. The spring element includes a lower spring member engaging the lower plates to bias the lower plates with an opening force in a second biasing direction generally away from the upper plates. The spacer tab of the lower spacer plate is received in a corresponding upper gap and the spacer tab of the upper spacer plate is received in a corresponding lower gap. The spring element is positioned in the upper gap and the lower gap. The upper plates and the lower plates are arranged in plate pairs. The spring element forces the upper plates and the lower plates of the plate pairs apart. The upper plates include upper limit tabs. The lower plates include lower limit tabs. The upper limit tabs and the lower limit tabs operate to limit spreading apart of the upper plates and the lower plates against the opening forces of the spring element.

BRIEF DESCRIPTION OF THE DRAWINGS

FIG. 3 illustrates various plate pairs, including upper plates and lower plates arranged relative to each other in the plate pairs in accordance with an exemplary embodiment.

FIG. 4 illustrates various plate pairs, including upper plates and lower plates arranged relative to each other in the plate pairs in accordance with an exemplary embodiment.

FIG. 5 is a cross-sectional view of a portion of the thermal bridge showing the spring element and bridge frame relative to the first pair of upper and lower plates in accordance with an exemplary embodiment.

FIG. 6 is an enlarged view of a portion of the thermal bridge shown in FIG. 5 in accordance with an exemplary embodiment.

DETAILED DESCRIPTION OF THE INVENTION

Figure 1:
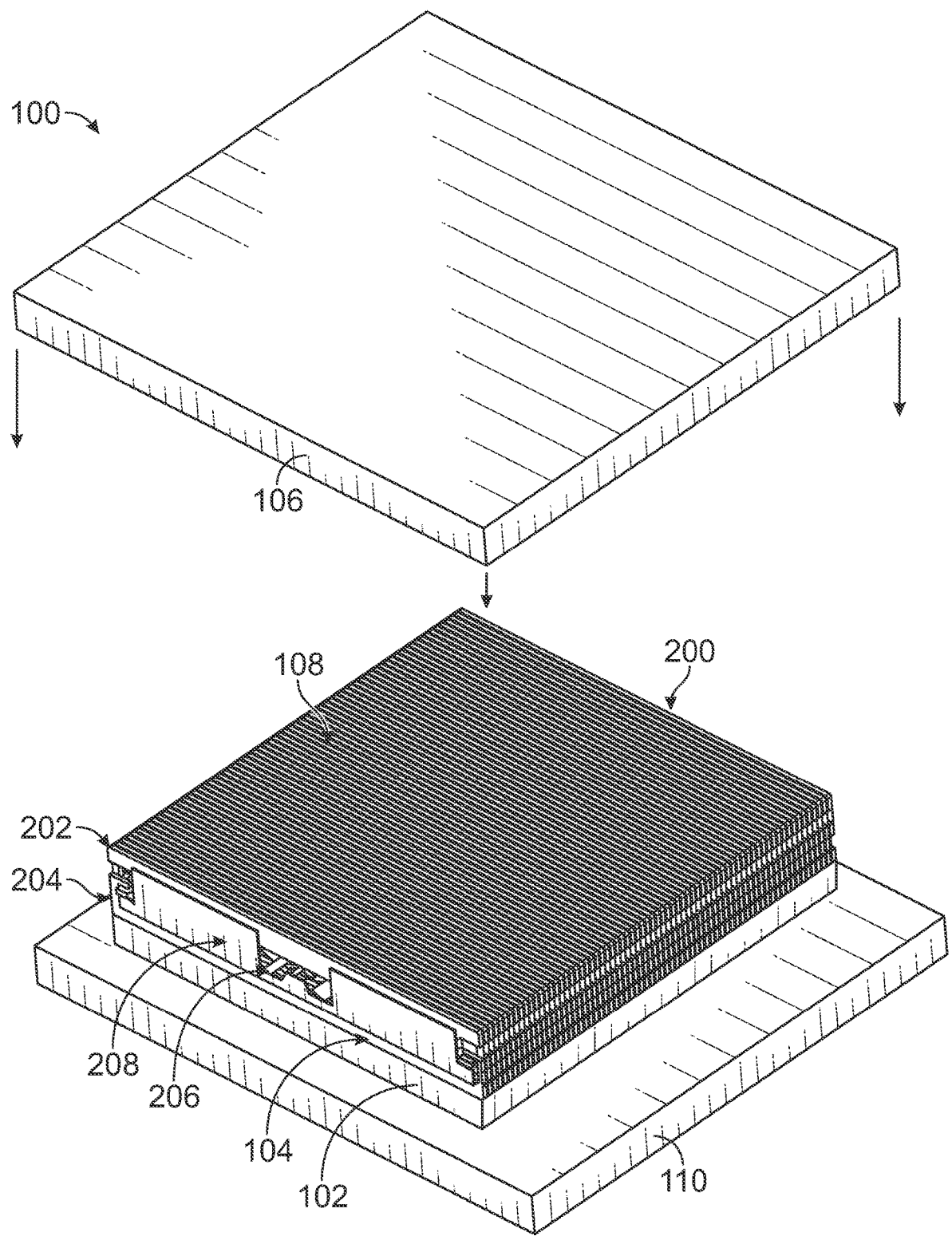
FIG. 1 is a front perspective view of a communication system and a thermal bridge in accordance with an exemplary embodiment for dissipating heat from at least one electrical component of the communication system.

FIG. 1 is a front perspective view of a communication system 100 and a thermal bridge 200 in accordance with an exemplary embodiment for dissipating heat from at least one electrical component 102 of the communication system 100. The thermal bridge 200 is configured to be thermally coupled to the electrical component 102 at a lower thermal interface 104 at a bottom of the thermal bridge 200. In an exemplary embodiment, a heat transfer device 106 is provided to dissipate heat from the thermal bridge 200. For example, the thermal bridge 200 is configured to be thermally coupled to the heat transfer device 106 at an upper thermal interface 108. The thermal bridge 200 thermally connects the electrical component 102 and the heat transfer device 106 to dissipate heat from the electrical component 102. The heat transfer device 106 may be a heat sink, such as a finned heat sink, configured to be air cooled by transferring heat to the passing airflow. In other various embodiments, the heat transfer device 106 may be a heat spreader, a cold plate having liquid cooling, and the like.

In an exemplary embodiment, the thermal bridge 200 is compressible between the electrical component 102 and the heat transfer device 106. In an exemplary embodiment, the lower thermal interface 104 is conformable to a shape of the electrical component 102 and the upper thermal interface 108 is conformable to a shape of the heat transfer device 106 for efficient thermal transfer therebetween. For example, the thermal bridge 200 may be a stacked plate-like structure wherein the individual plates are movable relative to each other to conform to the electrical component 102 and the heat transfer device 106.

In an exemplary embodiment, the electrical component 102 is mounted to a circuit board 110. In various embodiments, the electrical component 102 may be a communication connector, such as a receptacle connector, a header connector, a plug connector, or another type of communication connector. In other various embodiments, the electrical component 102 may be an electronic package, such as an integrated circuit. In other various embodiments, the electrical component 102 may be a pluggable module, such as an I/O transceiver module. Other types of electrical components may be provided in alternative embodiments.

In an exemplary embodiment, the thermal bridge 200 includes an upper bridge assembly 202, a lower bridge assembly 204, a spring element 206 between the upper and lower bridge assemblies 202, 204, and a bridge frame 208 for holding the upper and lower bridge assemblies 202, 204 together. The lower bridge assembly 204 is configured to thermally engage the electrical component 102. The upper bridge assembly 202 is configured to dissipate heat into the external environment and/or to the heat transfer device 106. The upper bridge assembly 202 is in thermal communication with the lower bridge assembly 204 and dissipates heat away from the lower bridge assembly 204 to cool the electrical component 102.

The spring element 206 biases the upper and lower bridge assemblies 202, 204 apart. The upper and lower bridge assemblies 202, 204 are compressible relative to each other. For example, the upper and lower bridge assemblies 202, 204 are compressible between the electrical component 102 and the heat transfer device 106 (for example, compress the spring element 206).

The bridge frame 208 provides support for the upper and lower bridge assemblies 202, 204. In an exemplary embodiment, the bridge frame 208 provides internal support through the bridge assemblies 202, 204. The internal support eliminates the need for an external frame, which provides more surface area for heat dissipation and/or for the thermal interface with the heat transfer device 106. However, in an alternative embodiment, the bridge frame 208 may extend around an outer perimeter of the thermal bridge 200, such as along the sides and ends, leaving the top and bottom to form thermal interfaces with the electrical component 102 and the heat transfer device 106.

In an exemplary embodiment, the spring element 206 presses the upper bridge assembly 202 outward in a first biasing direction (for example, upward) against the bridge frame 208 and the spring element 206 presses the lower bridge assembly 204 outward in a second biasing direction (for example, downward) against the bridge frame 208. The upper bridge assembly 202 and the lower bridge assembly 204 may be held by the bridge frame 208 in a manner to allow a limited amount of floating movement of the upper bridge assembly 202 and the lower bridge assembly 204 relative to the bridge frame 208.

Figure 2:
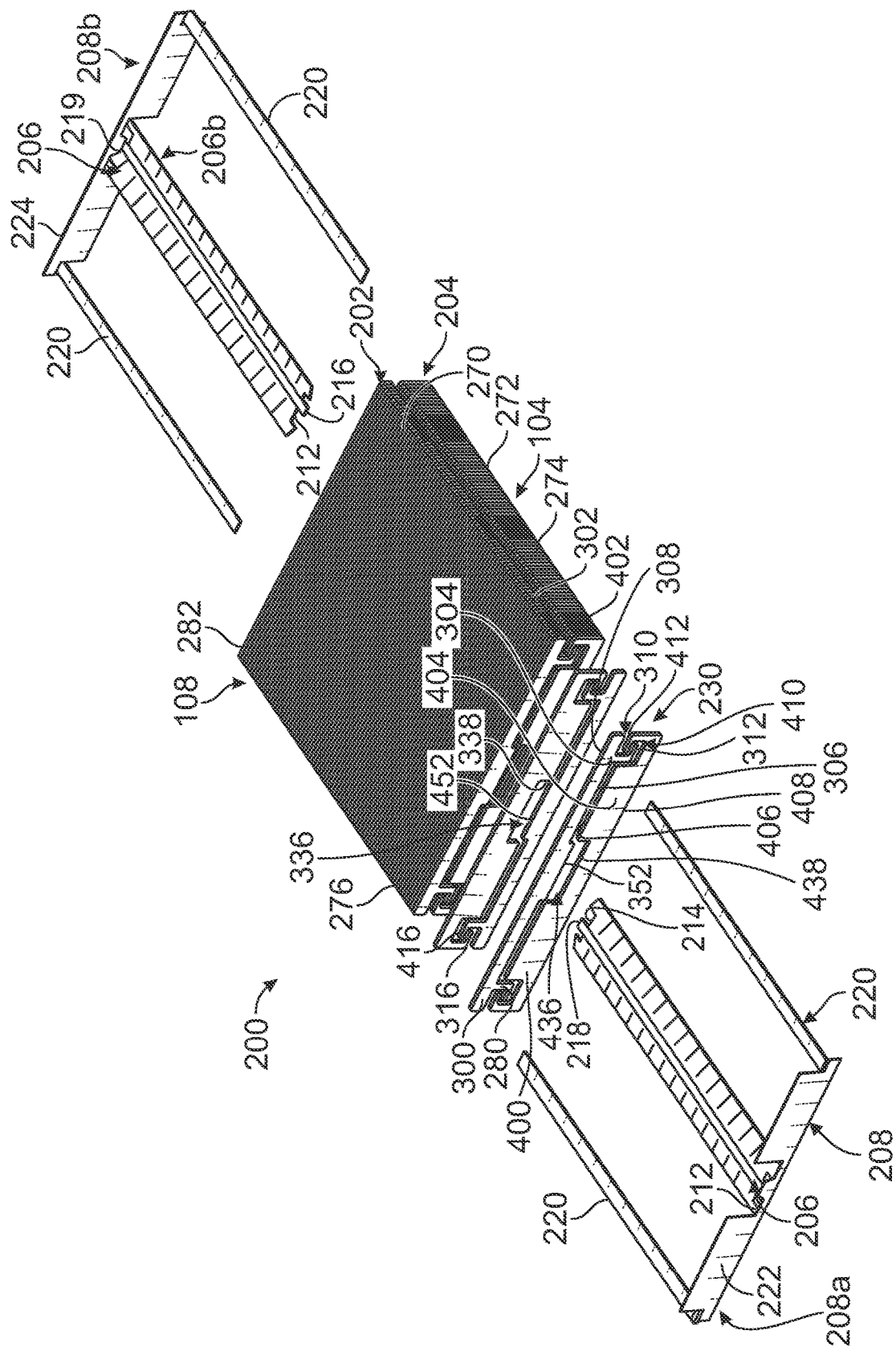
FIG. 2 is an exploded view of the thermal bridge in accordance with an exemplary embodiment.

FIG. 2 is an exploded view of the thermal bridge 200 in accordance with an exemplary embodiment. The thermal bridge 200 includes the upper bridge assembly 202 and the lower bridge assembly 204. The spring element 206 is located between the upper and lower bridge assemblies 202, 204. The bridge frame 208 is configured to hold the upper and lower bridge assemblies 202, 204. In an exemplary embodiment, the spring element 206 is a multi-piece spring element having a first spring element 206a at the first side and a second spring element 206b at the second side. The first and second spring element pieces cooperate to form the spring element 206. In alternative embodiments, the spring element 206 may be a single piece (for example, only the first spring element 206a). In an exemplary embodiment, the bridge frame 208 is a multi-piece spring element having a first bridge frame 208a at the first side and a second bridge frame 208b at the second side. The first and second bridge frame pieces cooperate to form the bridge frame 208. In alternative embodiments, the bridge frame 208 may be a single piece (for example, only the first bridge frame 208a).

In an exemplary embodiment, the thermal bridge 200 is parallelepiped (for example, generally box shaped). For example, the thermal bridge 200 includes a top 270, a bottom 272, a front 274, a rear 276, a first side 280, and a second side 282. The top 270 may be generally planar. The bottom 272 may be generally planar. The front 274 may be generally planar. The rear 276 may be generally planar. The first side 280 may be generally planar. The second side 282 may be generally planar. However, the thermal bridge 200 may have other shapes in alternative embodiments. The frame structure used to hold the thermal bridge 200 together is defined by the bridge frame 208. The bridge frame 208 may be contained generally within the interior of the thermal bridge 200 such that the outer surfaces of the thermal bridge 200 (for example, the top 270, bottom 272, front 274, rear 276, first side 280, and second side 282) are each exposed and accessible for heat dissipation and/or for interfacing with other components, such as the electrical component 102 and/or the heat transfer device 106 (both shown in FIG. 1). The bridge frame 208 allows for a large amount of usable external surface area for the thermal bridge 200. In an exemplary embodiment, the bridge frame 208 is exposed at the first side 280 and the second side 282, preferably at a small footprint, to hold the bridge assemblies 202, 204 together.

In an exemplary embodiment, no portion of the bridge frame 208 extends along the top 270 or the bottom 272. The bridge frame 208 is remote from the upper thermal interface 108 such that the bridge frame 208 does not obstruct the upper thermal interface 108 and provides a large amount of usable external surface area for interfacing with the heat transfer device 106. The bridge frame 208 is remote from the lower thermal interface 104 such that the bridge frame 208 does not obstruct the lower thermal interface 104 and provides a large amount of usable external surface area for interfacing with the electrical component 102. In an exemplary embodiment, no portion of the bridge frame 208 extends along the front 274 or the rear 276.

In an exemplary embodiment, the bridge assemblies 202, 204 each include a plurality of plates that are arranged together in plate stacks. The plates are interleaved with each other for thermal communication between the upper bridge assembly 202 and the lower bridge assembly 204. The individual plates are movable relative to each other such that the plates may be individually articulated to conform to the electrical component 102 and/or the heat transfer device 106. For example, the individual plates may conform to the electrical component 102 at the lower thermal interface 104 for improved contact and/or proximity between the thermal bridge 200 and the electrical component 102 and/or the individual plates may conform to the heat transfer device 106 at the upper thermal interface 108 for improved contact and/or proximity between the thermal bridge 200 and the heat transfer device 106. A gap or space may be provided between the plates of the upper and lower bridge assemblies 202, 204 to allow compressive movement of the spring element 206 between the bridge assemblies 202, 204.

In an exemplary embodiment, the upper bridge assembly 202 includes a plurality of upper plates 300 arranged in an upper plate stack 302. Each upper plate 300 has sides 304 extending between an inner end 306 and an outer end 308 of the upper plate 300. The inner end 306 faces the lower bridge assembly 204. The outer end 308 faces outward, such as toward the heat transfer device 106. Optionally, various upper plates 300 may have different shapes, such as different heights and/or different features between the inner end 306 and the outer end 308.

In an exemplary embodiment, the lower bridge assembly 204 includes a plurality of lower plates 400 arranged in a lower plate stack 402. Each lower plate 400 has sides 404 extending between an inner end 406 and an outer end 408 of the lower plate 400. The inner end 406 faces the upper bridge assembly 202. The outer end 408 faces outward, such as toward the electrical component 102 (shown in FIG. 1). Optionally, various lower plates 400 may have different shapes and/or heights between the inner end 406 and the outer end 408.

In an exemplary embodiment, the upper and lower plates 300, 400 are arranged in plate pairs 230. Each plate pair 230 includes one of the upper plates 300 and one of the lower plates 400. The plates 300, 400 in the plate pair 230 are aligned with each other. For example, the upper and lower plates 300, 400 are vertically stacked with the upper plate 300 above the lower plate 400. The plate pairs 230 are stacked together to form the thermal bridge 200 in the stacked arrangement. The bridge frame 208 holds the plate pairs 230 in the stacked arrangement. The spring element 206 is configured to be positioned between the upper and lower plates 300, 400 and spread the upper plates 300 apart from the lower plates 400.

With additional reference to FIGS. 3 and 4, FIGS. 3 and 4 illustrate various plate pairs 230, including upper plates 300 and lower plates 400 arranged relative to each other in the plate pairs 230. FIG. 3 shows a first pair 232. FIG. 4 shows a second pair 234. The upper plates 300 of the first pair 232 are different from the upper plates 300 of the second pair 234. The lower plates 400 of the first pair 232 are different from the lower plates 400 of the second pair 234.

In an exemplary embodiment, the upper plates 300 include upper pockets 310 that receive the bridge frame 208. In an exemplary embodiment, the upper pockets 310 are oversized relative to the bridge frame 208 to allow the upper plates 300 to move relative to the bridge frame 208, such as in a vertical direction to allow compression when mated with the heat transfer device 106.

In an exemplary embodiment, the upper plates 300 include upper limit tabs 312 used to position the upper plates 300 relative to the lower plates 400 and/or relative to the bridge frame 208. The upper limit tabs 312 may engage the lower plates 400 and/or the bridge frame 208 to position the upper plates 300 in the upper plate stack 302. The upper limit tabs 312 limit vertical movement of the upper plates 300, such as to limit spreading apart of the upper plates 300 from the lower plates 400. The spring element 206 may press the upper plates 300 outward (for example, upward) until the upper limit tabs 312 bottom out against the lower plates 400, the bridge frame 208, or other intervening structure.

In an exemplary embodiment, the upper limit tabs 312 extend into and/or form part of the upper pocket 310. The upper limit tabs 312 are contained within an envelope or perimeter of the upper plate 300. In an exemplary embodiment, each upper plate 300 includes multiple upper limit tabs 312, such as at opposite sides of the upper plate 300.

Each upper limit tab 312 includes an arm 314 and a finger 316. The arm 314 extends from the main portion of the upper plate 300. In the illustrated embodiment, the arm 314 extends vertically, such as perpendicular to the bottom edge of the upper plate 300. The finger 316 extends from the arm 314. For example, the finger 316 may extend generally horizontally, such as perpendicular to the arm 314. The upper limit tab 312 may be hook-shaped, such as being J-shaped. The arm 314 and/or the finger 316 may form the upper pocket 310. The upper pocket 310 is configured to receive a portion of the lower plate 400 (for example, a lower limit tab) and/or a portion of the bridge frame 208 (for example a spar).

In an exemplary embodiment, the upper limit tab 312 includes a stop surface 318. The stop surface 318 is configured to engage the lower plate 400 (for example, a lower limit tab of the lower plate 400) and/or the bridge frame 208 to limit or control positioning of the upper plate 300 in the thermal bridge 200. In the illustrated embodiment, the stop surface 318 is an upper surface of the upper limit tab 312.

In an exemplary embodiment, the upper plates 300 include upper bridge plates 320 (FIG. 4) and upper spacer plates 322 (FIG. 3). The upper spacer plates 322 are located between the upper bridge plates 320. The upper bridge plates 320 and the upper spacer plates 322 both include upper limit tabs 312.

With reference to FIG. 4, each upper bridge plate 320 includes a base 330 at the outer end 308 and overlapping regions 342, 344 at the inner end 306 configured to overlap with adjacent lower plates 400 of the lower bridge assembly 204. In various embodiments, the upper bridge plate 320 includes a first bridge portion 332 extending downward from the base 330 and a second bridge portion 334 extending downward from the base 330 with an upper gap 336 located between the first bridge portion 332 and the second bridge portion 334. In an exemplary embodiment, the upper gap 336 receives a portion of the spring element 206. The upper gap 336 is open at the inner end 306, such as to receive the lower plate 400 of the lower bridge assembly 204. The upper gap 336 is defined by edges 338 extending along the base 330 and the bridge portions 332, 334. The edges 338 at the top of the upper gap 336 are configured to engage the spring element 206 when assembled.

The upper limit tabs 312 extend from the inner end 306 of the upper bridge plate 320. In the illustrated embodiment, the upper limit tabs 312 are located at the opposite sides of the base 330. For example, the arms 314 are located at the side edges of the base 330 and the fingers 316 extend toward the interior from the arms 314. The upper pockets 310 are located inward of the arms 314. The upper pockets 310 receive portions of the lower plates 400 (for example, the lower limit tabs).

In an exemplary embodiment, the first bridge portion 332 defines the overlapping regions 342 at the sides 304 of the upper bridge plate 320 and the second bridge portion 334 defines the overlapping regions 344 at the sides 304 of the upper bridge plate 320. The overlapping regions 342, 344 are configured to overlap with adjacent lower plates 400 of the lower bridge assembly 204. The overlapping regions 342, 344 provide large surface areas configured to be thermally coupled to the lower plates.

With reference to FIG. 3, each upper spacer plate 322 includes a spacer base 350 at the outer end 308 and a spacer tab 352 extending from the spacer base 350. The spacer tab 352 extends from the inner end 306 of the upper spacer plate 322. The spacer tab 352 may be approximately centered along the spacer base 350. A bottom edge of the spacer tab 352 may engage the spring element 206 when assembled.

The upper limit tabs 312 extend from the inner end 306 of the upper spacer plate 322. In the illustrated embodiment, the upper limit tabs 312 are located at the opposite sides of the base 330. For example, the arms 314 are located near the side edges of the base 330 (for example, spaced inward form the edges) and the fingers 316 extend toward the exterior from the arms 314. The upper pockets 310 are located outward of the arms 314. The upper pockets 310 receive portions of the lower plates 400 (for example, the lower limit tabs).

In an exemplary embodiment, the lower plates 400 include lower pockets 410 that receive the bridge frame 208. In an exemplary embodiment, the lower pockets 410 are oversized relative to the bridge frame 208 to allow the lower plates 400 to move relative to the bridge frame 208, such as in a vertical direction to allow compression when mated with the heat transfer device 106.

In an exemplary embodiment, the lower plates 400 include lower limit tabs 412 used to position the lower plates 400 relative to the upper plates 300 and/or relative to the bridge frame 208. The lower limit tabs 412 may engage the upper plates 300 and/or the bridge frame 208 to position the lower plates 400 in the lower plate stack 402. The lower limit tabs 412 limit vertical movement of the lower plates 400, such as to limit spreading apart of the lower plates 400 from the upper plates 300. The spring element 206 may press the lower plates 400 outward (for example, downward) until the lower limit tabs 412 bottom out against the upper plates 300, the bridge frame 208, or other intervening structure.

In an exemplary embodiment, the lower limit tabs 412 extend into and/or form part of the lower pocket 410. The lower limit tabs 412 are contained within an envelope or perimeter of the lower plate 400. In an exemplary embodiment, each lower plate 400 includes multiple lower limit tabs 412, such as at opposite sides of the lower plate 400.

Each lower limit tab 412 includes an arm 414 and a finger 416. The arm 414 extends from the main portion of the lower plate 400. In the illustrated embodiment, the arm 414 extends vertically, such as perpendicular to the bottom edge of the lower plate 400. The finger 416 extends from the arm 414. For example, the finger 416 may extend generally horizontally, such as perpendicular to the arm 414. The lower limit tab 412 may be hook-shaped, such as being J-shaped. The arm 414 and/or the finger 416 may form the lower pocket 410. The lower pocket 410 is configured to receive a portion of the upper plates 300 (for example, the upper limit tab 312) and/or a portion of the bridge frame 208 (for example, a spar).

In an exemplary embodiment, the lower limit tab 412 includes a stop surface 418. The stop surface 418 is configured to engage the upper plates 300 (for example, the upper limit tab 312 of the upper plates 300) and/or the bridge frame 208 to limit or control positioning of the lower plate 400 in the thermal bridge 200. In the illustrated embodiment, the stop surface 418 is a lower surface of the lower limit tab 412.

In an exemplary embodiment, the lower plates 400 include lower bridge plates 420 (FIG. 3) and lower spacer plates 422 (FIG. 4). The lower spacer plates 422 are located between the lower bridge plates 420. The lower bridge plates 420 and the lower spacer plates 422 both include lower limit tabs 412.

With reference to FIG. 3, each lower bridge plate 420 includes a base 430 at the outer end 408 and overlapping regions 442, 444 at the inner end 406 configured to overlap with adjacent upper plates 300 of the upper bridge assembly 202. For example, the overlapping regions 442, 444 overlap with the overlapping regions 342, 344 of the upper bridge plates 320. In various embodiments, the lower bridge plate 420 includes a first bridge portion 432 extending upward from the base 430 and a second bridge portion 434 extending upward from the base 430 with a lower gap 436 located between the first bridge portion 432 and the second bridge portion 434. The lower gap 436 is open at the inner end 406, such as to receive the spacer tab 352 of the corresponding upper spacer plate 322. The lower gap 436 is defined by edges 438 extending along the base 430 and the bridge portions 432, 434. The edges 438 may guide the spacer tab 352 into the lower gap 436. Optionally, the edges 438 may be chamfered to guide the spacer tab 352 into the lower gap 436. The edges 438 at the bottom of the lower gap 436 is configured to engage the spring element 206 when assembled. For example, the spring element 206 may be received in the lower gap 436.

The lower limit tabs 412 extend from the inner end 406 of the lower bridge plate 420. In the illustrated embodiment, the lower limit tabs 412 are located at the opposite sides of the base 430. For example, the arms 414 are located at the side edges of the base 430 and the fingers 416 extend toward the interior from the arms 414. The lower pockets 410 are located inward of the arms 414. The lower pockets 410 receive the upper limit tabs 312 of the upper spacer plate 322. The lower limit tabs 412 cooperate with the upper limit tabs 312 to limit spreading apart of the upper plate 300 and the lower plate 400 against the opening forces of the spring element 206. For example, the fingers 316, 416 may directly engage each other to position the upper plate 300 relative to the lower plate 400. The fingers 316, 416 may engage the bridge frame 208 to stop spreading apart.

In an exemplary embodiment, the first bridge portion 432 defines the overlapping regions 442 at the sides 404 of the lower bridge plate 420 and the second bridge portion 434 defines the overlapping regions 444 at the sides 404 of the lower bridge plate 420. The overlapping regions 442, 444 are configured to overlap with the overlapping regions 342, 344 of the adjacent upper bridge plates 320. The overlapping regions 442, 444 provide large surface areas configured to be thermally coupled to the upper bridge plates 320. The overlapping regions 442, 444 are configured to overlap the overlapping regions 342, 344 by an overlap distance sufficient to allow efficient thermal transfer between the lower plates 400 and the upper plates 300. The sides of the plates are slidable relative to each other to allow movement between the upper plates 300 and the lower plates 400 and change the overlap distance.

With reference to FIG. 4, each lower spacer plate 422 includes a spacer base 450 at the outer end 408 and a spacer tab 452 extending from the spacer base 450. The spacer tab 452 extends from the inner end 406 of the lower spacer plate 422. The spacer tab 452 may be approximately centered along the spacer base 450. In an exemplary embodiment, the spacer tab 452 is configured to be aligned with the upper gap 336 of the corresponding upper bridge plate 320, such as to be received in the upper gap 336. The spacer tab 452 may be guided into the upper gap 336 by the edges 338. The edges 338 may be chamfered to guide the spacer tab 452 into the upper gap 336. A top edge of the spacer tab 452 may engage the spring element 206 when assembled.

The lower limit tabs 412 extend from the inner end 406 of the lower spacer plate 422. In the illustrated embodiment, the lower limit tabs 412 are located at the opposite sides of the base 430. For example, the arms 414 are located near the side edges of the base 430 (for example, spaced inward form the edges) and the fingers 416 extend toward the exterior from the arms 414. The lower pockets 410 are located outward of the arms 414. The lower pockets 410 receive the upper limit tabs 312 of the upper bridge plate 320. The lower limit tabs 412 cooperate with the upper limit tabs 312 to limit spreading apart of the upper plate 300 and the lower plate 400 against the opening forces of the spring element 206. For example, the fingers 316, 416 may directly engage each other to position the upper plate 300 relative to the lower plate 400. The fingers 316, 416 may engage the bridge frame 208 to stop spreading apart.

With reference back to FIG. 2, the spring element 206 is separate and discrete from the upper and lower bridge assemblies 202, 204. The spring element 206 may be a stamped and formed part. The spring element 206 is manufactured from a thin metal material such that the spring element 206 is flexible. In an exemplary embodiment, the spring element 206 includes a plurality of spring plates 210 that are arranged in a spring plate stack located between the upper and lower bridge assemblies 202, 204. In an exemplary embodiment, the spring element 206 includes first and second spring plates 210a, 201b, which are parts of the first and second spring elements 206, respectively. In the illustrated embodiment, the spring plates 210a, 210b are vertically stacked to provide spring forces in the vertical direction. Other types of spring elements 206 may be used in alternative embodiments, such as coil springs, leaf springs, C-shaped channel springs, and the like. Optionally, the spring elements 206 may be segmented to include a plurality of spring fingers separated by gaps that are movable independent from each other to provide independent spring pressure.

The spring element 206 is configured to be received in the upper and lower gaps 336, 436. The spring element 206 is located between the upper plates 300 and the lower plates 400. For example, the spring element 206 is located between the spacer tab 352 and the edge 438 at the top of the upper gap 436 and the spring element 206 is located between the spacer tab 452 and the edges 338 at the bottom of the lower gap 336. The spring plates 210 are compressible between the upper plates 300 and the lower plates 400. In the illustrated embodiment, the spring plates 210 are cupped leaf springs arranged back-to-back to form the spring element 206. The spring plates 210 are arranged in an upward facing and downward facing pattern. Optionally, multiple upward facing and lower facing elements may be arranged in a spring stack. Any number of spring plates 210 may be provided depending on the amount of spring force required, the spacing between the upper plates 300 and the lower plates 400, and the size of the spring plates 210. Other types of spring elements may be provided in alternative embodiments.

The spring element 206 extends between a first side 212 and a second side 214. The spring element 206 includes tabs 216, 218 at the first and second sides 212, 214, respectively. The tabs 216, 218 may be used for locating the spring element 206 relative to the bridge frame 208. The tabs 216, 218 may engage the bridge frame 208 to position the spring element 206 internally within the thermal bridge 200. The tabs 216, 218 may be welded to the bridge frame 208.

In an exemplary embodiment, the bridge frame 208 includes connecting elements 220 that extend internally through the upper bridge assembly 202 and the lower bridge assembly 204. For example, the bridge frame 208 may include first and second connecting elements 220a, 220b, which are parts of the first and second bridge frames 208a, 208b. The connecting elements 220 are configured to capture the upper plates 300 in the upper plate stack 302 and the lower plates 400 and the lower plate stack 402. In an exemplary embodiment, the connecting elements 220 are received in the upper pockets 310 and the lower pockets 410 between the upper plates 300 and the lower plates 400. The connecting elements 220 may be located between the upper limit tabs 312 and the lower limit tabs 412. For example, the fingers 316, 416 may be located on opposite sides of the connecting elements 220. The connecting elements 220 limit spreading apart of the upper and lower plates 300, 400. The upper limit tabs 312 engage the connecting elements 220 to limit spreading apart (upward movement) of the upper plates 300. The lower limit tabs 412 engage the connecting elements 220 to limit spreading apart (downward movement) of the lower plates 400.

In an exemplary embodiment, the connecting elements 220 are spars and may be referred to hereinafter as spars 220. The connecting elements 220 may be coupled to opposite side plates 222 or 224 of the bridge frame 208. For example, the connecting element 220 may be latched or welded to the opposite side plate 222, 224. In an exemplary embodiment, the connecting elements 220 include one or more upper connecting element and one or more lower connecting element. The upper and lower connecting elements 220 may be arranged side-by-side. The upper and lower connecting elements 220 may be received in the upper and lower pockets 310, 410, such as between the fingers 316, 416.

In an exemplary embodiment, the bridge frame 208 includes a first side plate 222 at a first side of the upper bridge assembly 202 and a first side of the lower bridge assembly 204 and a second side plate 224 at a second side of the upper bridge assembly 202 and a second side of the lower bridge assembly 204. The connecting elements 220 extend between the first side plate 222 and the second side plate 224. In various embodiments, the connecting elements 220 may be formed integral with the first side plate 222 and/or the second side plate 224. For example, the side plates 222, 224 and the connecting elements 220 may be stamped and formed from a sheet of metal. In alternative embodiments, the connecting elements 220 may be separate from the side plates 222, 224 and secured thereto, such as by soldering, crimping, latching, clipping, using fasteners or otherwise securing the connecting elements 220 to the side plates 222, 224.

In an exemplary embodiment, the connecting elements 220 are flat, planar spars configured to pass through the upper and lower plates 300, 400. For example, the connecting elements 220 may be stamped and formed from a metal sheet. The connecting elements 220 may be generally rectangular in cross-section. However, other types of connecting elements may be used in alternative embodiments. For example, the connecting elements 220 may be round or square pins that may be manufactured by an extrusion process. Other types of connecting elements 220 may be used in alternative embodiments. In other embodiments, the bridge frame 208 may include the side plates 222, 224 without the use of the connecting elements 220.

Figure 7:
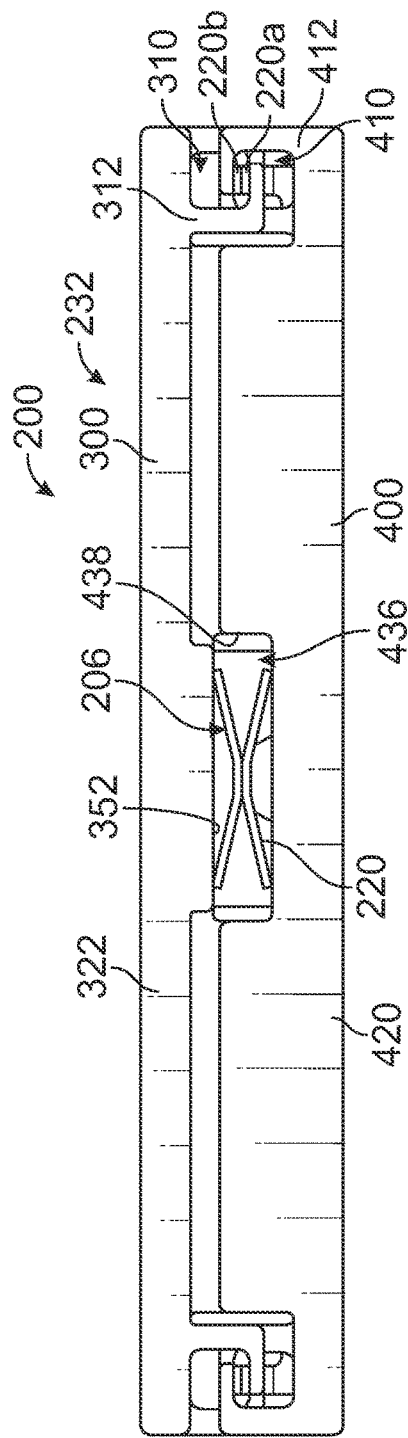
FIG. 7 is a cross-sectional view of a portion of the thermal bridge showing the spring element and bridge frame relative to the second pair of upper and lower plates in accordance with an exemplary embodiment.
Figure 8:
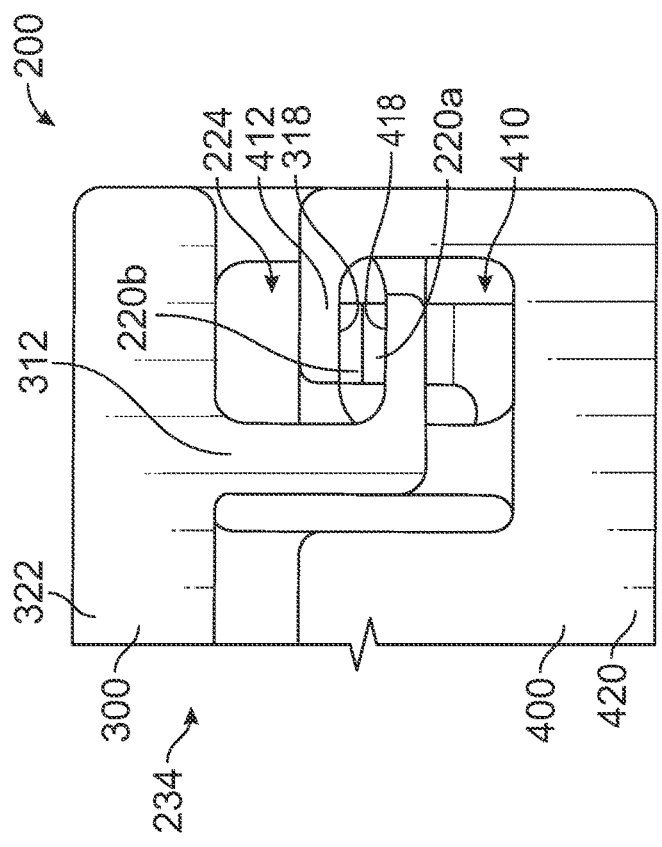
FIG. 8 is an enlarged view of a portion of the thermal bridge shown in FIG. 7 in accordance with an exemplary embodiment.

FIG. 5 is a cross-sectional view of a portion of the thermal bridge 200 showing the spring element 206 and bridge frame 208 relative to the second pair 234 of upper and lower plates 300, 400 in accordance with an exemplary embodiment. FIG. 6 is an enlarged view of a portion of the thermal bridge 200 shown in FIG. 5. FIG. 7 is a cross-sectional view of a portion of the thermal bridge 200 showing the spring element 206 and bridge frame 208 relative to the first pair 232 of upper and lower plates 300, 400 in accordance with an exemplary embodiment. FIG. 8 is an enlarged view of a portion of the thermal bridge 200 shown in FIG. 7. FIGS. 7 and 8 show the upper spacer plate 322 and the lower bridge plate 420. FIGS. 5 and 6 show the upper bridge plate 320 and the lower spacer plate 422.

When assembled, the spring element 206 is located between the upper and lower plates 300, 400. The spring element 206 biases the upper and lower plates 300, 400 apart. The upper and lower limit tabs 312, 412 control positioning of the upper and lower plates 300, 400 in the plate stacks. For example, the upper and lower limit tabs 312, 412 limit spreading apart of the upper and lower plates 300, 400 at a predetermined outer limit. The spring element 206 is compressible between the upper and lower plates 300, 400, such as when mated with the electrical component 102 and the heat transfer device 106.

With reference to FIG. 5, the lower spacer plate 422 is aligned with the upper bridge plate 320. The spacer tab 452 is aligned with the upper gap 336. The spacer tab 452 may be movable into/out of and/or within the upper gap 336 as the thermal bridge 200 is compressed and expanded. The edges 338 of the upper gap 336 guide the spacer tab 452 in the upper gap 336. With reference to FIG. 7, the upper spacer plate 322 is aligned with the lower bridge plate 420. The spacer tab 352 is aligned with the lower gap 436. The spacer tab 352 may be movable into/out of and/or within the lower gap 436 as the thermal bridge 200 is compressed and expanded. The edges 438 of the lower gap 436 guide the spacer tab 352 in the lower gap 436.

The spring element 206 is received in the upper gap 336 between the upper plate 300 and the lower plate 400. The spring element 206 presses the upper plate 300 in an upward biasing direction and presses the lower plate 400 in a downward biasing direction. The spring element 206 tends to separate the upper plate 300 from the lower plate 400 to press the upper plate 300 into thermal engagement with the heat transfer device 106 and to press the lower plate 400 into thermal engagement with the electrical component 102. The upper plates 300 and the lower plates 400 are independently movable relative to each other and relative to adjacent upper plates 300 and lower plates 400. The upper plates 300 are configured to float relative to the lower plates 400 and the spring elements 206 allow the floating movement of the upper plates 300 and the lower plates 400. As such, the upper mating interface is conformable to the heat transfer device 106 and the lower mating interface is conformable to the electrical component 102.

The bridge frame 208 is located between the upper plates 300 and the lower plates 400. For example, the connecting elements 220 extend from the side plate 222 at the end and pass through the pockets 310, 410 (for example, through the entire stack). The limit tabs 312, 412 interface with the connecting elements 220 to position the upper and lower plates 300, 400 relative to each other and define outer spreading limits of the upper and lower plates 300, 400 relative to each other. For example, the stop surfaces 318 of the upper limit tabs 312 (for example, top surface of the finger 316) engage the lower surfaces of the connecting elements 220 and the stop surfaces 418 of the lower limit tabs 412 (for example, bottom surface of the finger 416) engage the upper surfaces of the connecting elements 220. The connecting elements 220 limit spreading apart of the upper and lower plates 300, 400 from each other. The spring element 206 presses the upper plates 300 upward until the stop surfaces 318 engage the connecting elements 220. The spring element 206 presses the lower plates 400 downward until the stop surfaces 418 engage the connecting elements 220.

Figure 9:
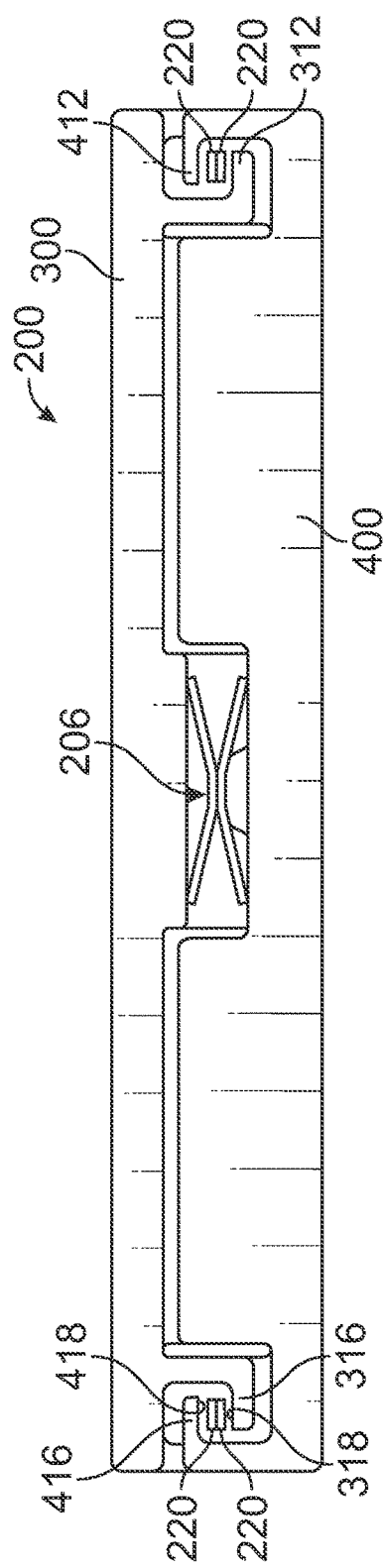
FIG. 9 is a cross-sectional view of a portion of the thermal bridge showing the thermal bridge in a compressed state in accordance with an exemplary embodiment.

FIG. 9 is a cross-sectional view of a portion of the thermal bridge 200 showing the thermal bridge 200 in a compressed state in accordance with an exemplary embodiment. In the compressed state (compared to the expanded state shown in FIGS. 5 and 7), the spring element 206 is compressed between the upper and lower plates 300, 400. The upper plate 300 and/or the lower plate 400 may be moved relatively closer to the other to the compressed positions when mated to the electrical component and/or the heat transfer device 106. For example, the bases are moved toward each other in the compressed state.

When compressed, the upper limit tabs 312 are moved relative to the lower limit tabs 412. For example, the finger 316 is moved away from the finger 416 increasing the spacing between the stop surfaces 318, 418. The gap or spacing between the fingers 316, 416 is increased in the compressed state. The upper fingers 316 may be moved away from the connecting elements 220 and/or the lower fingers 416 may be moved away from the connecting elements 220.

Figure 10:
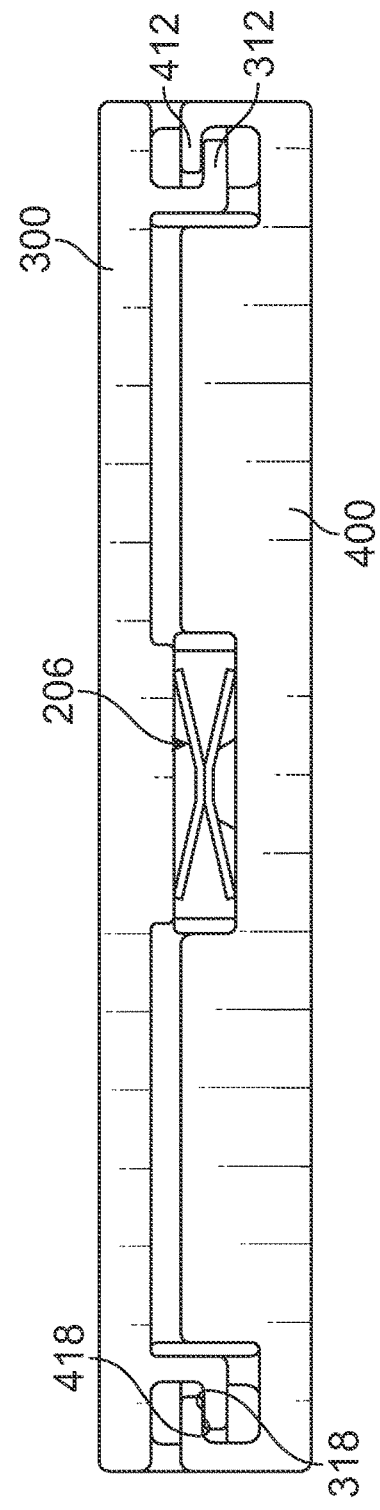
FIG. 10 is a cross-sectional view of a portion of the thermal bridge showing the thermal bridge in accordance with an exemplary embodiment.

FIG. 10 is a cross-sectional view of a portion of the thermal bridge 200 showing the thermal bridge 200 in accordance with an exemplary embodiment. FIG. 10 illustrates the thermal bridge 200 with the spring element 206 between the upper and lower plates 300, 400. The thermal bridge 200 is provided without the connecting elements 220 (shown in FIG. 5). In contrast, the upper limit tabs 312 directly engage the lower limit tabs 412 in the expanded state to limit spreading apart of the upper and lower plates 300, 400. The stop surfaces 318, 418 directly engage each other in the expanded state.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A thermal bridge comprising:
an upper bridge assembly including a plurality of upper plates arranged in an upper plate stack, each upper plate having a front end and a rear end, each upper plate having sides between the front end and the rear end, each upper plate having an inner end and an outer end;
a lower bridge assembly including a plurality of lower plates arranged in a lower plate stack, each lower plate having a front end and a rear end, each lower plate having sides between the front end and the rear end, each lower plate having an inner end and an outer end, the outer ends of the lower plates configured to face and thermally couple to an electrical component, the sides of the lower plates facing the sides of the upper plates to thermally interface the lower plates with the upper plates;
a spring element positioned between the upper bridge assembly and the lower bridge assembly, the spring element including an upper spring member engaging the upper plates to bias the upper plates with an opening force generally away from the lower plates, the spring element including a lower spring member engaging the lower plates to bias the lower plates with an opening force generally away from the upper plates;
wherein the upper plates and the lower plates are arranged in plate pairs, the spring element forcing the upper plates and the lower plates of the plate pairs apart, the upper plates including upper limit tabs, the lower plates including lower limit tabs, the upper limit tabs and the lower limit tabs operating to limit spreading apart of the upper plates and the lower plates against the opening forces of the spring element.

2. The thermal bridge of claim 1, wherein the upper limit tabs and the lower limit tabs contain vertical movement of the upper plates and the lower plates in a predetermined confined space.

3. The thermal bridge of claim 1, wherein the upper plate includes an upper pocket, the upper limit tab extending along a bottom of the upper pocket, the upper pocket receiving the lower limit tab of the corresponding lower plate of the plate pair, the lower plate includes a lower pocket, the lower limit tab extending along a top of the lower pocket, the lower pocket receiving the upper limit tab of the corresponding upper plate of the plate pair.

4. The thermal bridge of claim 1, wherein the upper limit tabs are located at the front ends and the rear ends of the upper plates and the lower limit tabs are located at the front ends and the rear ends of the lower plates.

5. The thermal bridge of claim 1, wherein the upper limit tabs are hook shaped capturing the corresponding lower limit tabs in pockets of the hook shaped upper limit tabs.

6. The thermal bridge of claim 1, wherein the upper limit tab directly interfaces with the lower limit tab to limit spreading apart of the upper plate and the lower plate.

7. The thermal bridge of claim 1, wherein the upper limit tab and the lower limit tab interface with an intervening structure to limit spreading apart of the upper plate and the lower plate.

8. The thermal bridge of claim 1, further comprising a bridge frame including a spar passing through the thermal bridge between the upper plate stack and the lower plate stack, the upper limit tabs configured to engage the spar to limit spreading apart of the upper plates and the lower plates, the lower limit tabs configured to engage the spar to limit spreading apart of the upper plates and the lower plates.

9. The thermal bridge of claim 8, wherein the spar includes an upper surface and a lower surface, the upper limit tabs extending below the spar to engage the lower surface, the lower limit tabs extending above the spar to engage the upper surface.

10. The thermal bridge of claim 1, wherein the upper bridge assembly includes an upper thermal interface configured to be thermally coupled to a heat transfer device, the upper plates and the lower plates being movable relative to each other, relative to the electrical component, and relative to the heat transfer device.

11. The thermal bridge of claim 1, further comprising a bridge frame including a first side plate at a first side of the upper bridge assembly and a first side of the lower bridge assembly and a second side plate at a second side of the upper bridge assembly and a second side of the lower bridge assembly, the upper plates held in the upper plate stack between the first side plate and the second side plate, the lower plates held in the lower plate stack between the first side plate and the second side plate.

12. The thermal bridge of claim 1, wherein the upper plates include upper overlapping regions and the lower plates include lower overlapping regions, the upper bridge assembly and the lower bridge assembly being interested such that the upper overlapping regions thermally interface with the lower overlapping regions to thermally couple the upper plates and the lower plates.

13. The thermal bridge of claim 1, wherein the upper plates include upper bridge plates and upper spacer plates between the upper bridge plates, the lower plates including lower bridge plates and lower spacer plates between the lower bridge plates, the upper bridge plates being aligned with the lower spacer plates and the lower bridge plates being aligned with the upper spacer plates.

14. The thermal bridge of claim 13, wherein each upper bridge plate includes a base, a first bridge portion extending from the base and a second bridge portion extending from the base with an upper gap between the first bridge portion and the second bridge portion of the upper bridge plate, each upper spacer plate including a spacer base and a spacer tab extending from the spacer base, and wherein each lower bridge plate includes a base, a first bridge portion extending from the base and a second bridge portion extending from the base with a lower gap between the first bridge portion and the second bridge portion of the lower bridge plate, each lower spacer plate including a spacer base and a spacer tab extending from the spacer base, the spacer tab of the lower spacer plate being received in a corresponding upper gap, the spacer tab of the upper spacer plate being received in a corresponding lower gap, the spring element being positioned in the upper gap and the lower gap.

15. The thermal bridge of claim 14, wherein the first and second bridge portions of the upper bridge plates overlap with the first and second bridge portions of the lower bridge plates to thermally couple the upper plates and the lower plates.

16. A thermal bridge comprising:
an upper bridge assembly including a plurality of upper plates arranged in an upper plate stack, each upper plate having a front end and a rear end, each upper plate having sides between the front end and the rear end, each upper plate having an inner end and an outer end;
a lower bridge assembly including a plurality of lower plates arranged in a lower plate stack, each lower plate having a front end and a rear end, each lower plate having sides between the front end and the rear end, each lower plate having an inner end and an outer end, the outer ends of the lower plates configured to face and thermally couple to an electrical component, the sides of the lower plates facing the sides of the upper plates to thermally interface the lower plates with the upper plates;
a spring element positioned between the upper bridge assembly and the lower bridge assembly, the spring element including an upper spring member engaging the upper plates to bias the upper plates with an opening force generally away from the lower plates, the spring element including a lower spring member engaging the lower plates to bias the lower plates with an opening force generally away from the upper plates; and
a bridge frame having a first side plate at a first side of the thermal bridge and a second side plate at a second side of the terminal bridge, the bridge frame including a spar connecting the first and second side plates, the spar passing through the thermal bridge between the upper plate stack and the lower plate stack;
wherein the upper plates and the lower plates are arranged in plate pairs, the spring element forcing the upper plates and the lower plates of the plate pairs apart, the upper plates including upper limit tabs, the lower plates including lower limit tabs, the spar being located between the upper limit tabs and the lower limit tabs, the upper limit tabs and the lower limit tabs engaging the spar to limit spreading apart of the upper plates and the lower plates against the opening forces of the spring element.

17. The thermal bridge of claim 16, wherein the upper plate includes an upper pocket, the upper limit tab extending along a bottom of the upper pocket, the upper pocket receiving the spar, the upper pocket receiving the lower limit tab of the corresponding lower plate of the plate pair, the lower plate includes a lower pocket, the lower limit tab extending along a top of the lower pocket, the lower pocket receiving the upper limit tab of the corresponding upper plate of the plate pair, the lower pocket receiving the spar.

18. The thermal bridge of claim 16, wherein the spar includes an upper surface and a lower surface, the upper limit tabs extending below the spar to engage the lower surface, the lower limit tabs extending above the spar to engage the upper surface.

19. The thermal bridge of claim 16, wherein the upper plates include upper bridge plates and upper spacer plates between the upper bridge plates, the lower plates including lower bridge plates and lower spacer plates between the lower bridge plates, the upper bridge plates being aligned with the lower spacer plates and the lower bridge plates being aligned with the upper spacer plates;
- wherein each upper bridge plate includes a base, a first bridge portion extending from the base and a second bridge portion extending from the base with an upper gap between the first bridge portion and the second bridge portion of the upper bridge plate,
- wherein each upper spacer plate including a spacer base and a spacer tab extending from the spacer base;
- wherein each lower bridge plate includes a base, a first bridge portion extending from the base and a second bridge portion extending from the base with a lower gap between the first bridge portion and the second bridge portion of the lower bridge plate;
- wherein each lower spacer plate including a spacer base and a spacer tab extending from the spacer base;
- wherein the spacer tab of the lower spacer plate is received in a corresponding upper gap and the spacer tab of the upper spacer plate is received in a corresponding lower gap, and wherein the spring element being positioned in the upper gap and the lower gap.

20. A thermal bridge comprising:
- an upper bridge assembly including a plurality of upper plates arranged in an upper plate stack, each upper plate having a front end and a rear end, each upper plate having sides between the front end and the rear end, each upper plate having an inner end and an outer end, the upper plates including upper bridge plates and upper spacer plates, the upper bridge plates having upper overlapping regions, wherein each upper bridge plate includes a base, a first bridge portion extending from the base and a second bridge portion extending from the base with an upper gap between the first bridge portion and the second bridge portion of the upper bridge plate, each upper spacer plate including a spacer base and a spacer tab extending from the spacer base;
- a lower bridge assembly including a plurality of lower plates arranged in a lower plate stack, each lower plate having a front end and a rear end, each lower plate having sides between the front end and the rear end, each lower plate having an inner end and an outer end, the lower plates including lower bridge plates and lower spacer plates, the lower bridge plates having lower overlapping regions, the lower plates configured to face and thermally couple to an electrical component, the lower spacer plates being aligned with the upper bridge plates and the lower bridge plates being aligned with the upper spacer plates such that the lower overlapping regions overlap with the upper overlapping regions, the sides of the lower bridge plates thermally interfacing with the sides of the upper bridge plates, wherein each lower bridge plate includes a base, a first bridge portion extending from the base and a second bridge portion extending from the base with a lower gap between the first bridge portion and the second bridge portion of the lower bridge plate, each lower spacer plate including a spacer base and a spacer tab extending from the spacer base; and
- a spring element positioned between the upper bridge assembly and the lower bridge assembly, the spring element including an upper spring member engaging the upper plates to bias the upper plates with an opening force in a first biasing direction generally away from the lower plates, the spring element including a lower spring member engaging the lower plates to bias the lower plates with an opening force in a second biasing direction generally away from the upper plates;
- wherein the spacer tab of the lower spacer plate is received in a corresponding upper gap and the spacer tab of the upper spacer plate is received in a corresponding lower gap, the spring element being positioned in the upper gap and the lower gap; and
- wherein the upper plates and the lower plates are arranged in plate pairs, the spring element forcing the upper plates and the lower plates of the plate pairs apart, the upper plates including upper limit tabs, the lower plates including lower limit tabs, the upper limit tabs and the lower limit tabs operating to limit spreading apart of the upper plates and the lower plates against the opening forces of the spring element.

* * * * *